United States Patent [19]
Schellenberg

[11] Patent Number: 6,163,220
[45] Date of Patent: Dec. 19, 2000

[54] HIGH-VOLTAGE, SERIES-BIASED FET AMPLIFIER FOR HIGH-EFFICIENCY APPLICATIONS

[76] Inventor: James M. Schellenberg, 18091 Fieldbury La., Huntington Beach, Calif. 92647

[21] Appl. No.: 09/325,860

[22] Filed: Jun. 4, 1999

Related U.S. Application Data

[60] Provisional application No. 60/088,116, Jun. 5, 1998.

[51] Int. Cl.$^7$ .................................................. H03F 3/68
[52] U.S. Cl. ...................................... 330/295; 330/124 R
[58] Field of Search ............................... 330/124 R, 295, 330/296, 297, 302, 307, 310

[56] References Cited

U.S. PATENT DOCUMENTS

| | | | |
|---|---|---|---|
| 5,206,604 | 4/1993 | Vaninetti | 330/124 R |
| 5,208,554 | 5/1993 | Endler et al. | 330/295 |
| 5,694,085 | 12/1997 | Walker | 330/295 |

OTHER PUBLICATIONS

Ezzeddine, A., Hung, H–L.A., Huang, H.C., "High–Voltage FET Amplifiers for Satellite and Phased–Array Applications," 1985 IEEE MMT–S Digest, pp. 336–339, Jun. 1985.
Peterson, K.E. et al., "30–V MMIC Power Amplifier With Novel Bias Circuitry," 1991 IEEE MMT–S Digest, pp. 823–826, Jun. 1991.
Schellenberg, J.M., "A High–Voltage, Ka–Band Power MMIC with 41% Efficiency," IEEE GaAs IC Sym. Digest, pp. 284–287, Oct. 1995.
Biedenbender, M.D. et al., "A Power HEMT Production Process For High Efficiency Ka–Band MMIC Power Amplifiers," IEEE GaAs IC Sym., pp. 341–344, Oct. 1993.
Ferguson, D.W. et al., "35 GHz Psuedomorphic HEMT MMIC Power Amplifier," IEEE MTT–S Digest, pp. 335–338, Jun. 1991.
Chi, J.H. et al., "1–W High–Efficiency Q–Band MMIC Power Amplifier," IEEE Microwave and Guided Wave Letters, vol. 5, No. 1, pp. 21–23, Jan. 1995.

*Primary Examiner*—Steven J. Mottola
*Attorney, Agent, or Firm*—James Creighton Wray; Meera P. Narasimhan

[57] ABSTRACT

An integrated circuit two-stage power amplifier provides a high-voltage, series-biased FET amplifier for high-efficiency applications. An input is connected to an input matching network, and a driver cell provides power from the input matching network to an interstage power dividing network. Multiple similar cells in a second stage are connected between the interstage power dividing network and an output matching and combining network and are biased by a series-connected active biasing network. An output is connected to the output matching and combining network. One series-connected active biasing network includes series-connected resistances and a second string of series-connected buffer cells connected between the series-connected resistances and the RF power cells for biasing the RF cells.

TABLE 1

State-of-the-Art, Ka-band MMIC Results

| Freq. (GHz) | Power (W) | Gain (dB) | PAE (%) | BW (GHz) | #Stg. | Chip Voltage |
|---|---|---|---|---|---|---|
| 33 | 0.66 | 16.2 | 41.1 | 2.7 | 2 | 20 |
| 33 | 1.12 | 12.5 | 35.8 | 2.5 | 2 | 28 |
| 30 | 0.5 | 8.5 | 32.3 | 6 | 2 | 4 |
| 35 | 1.3 | 9 | 24 | 2 | 2 | 5 |
| 36 | 0.22 | 20 | 21.5 | 4 | 3 | 6 |
| 40 | 1.0 | 9 | 29.4 | 6 | 2 | 4 |

11 Claims, 5 Drawing Sheets

HIGH-VOLTAGE, SERIES-BIASED FET AMPLIFIER FOR HIGH-EFFICIENCY APPLICATIONS

This application claims the benefit of U.S. Provisional Application No. 60/088,116, filed Jun. 5, 1998.

BACKGROUND OF THE INVENTION

The DC-to-RF conversion efficiency of a RF, microwave or millimeter-wave system is a key driving function for systems where prime power is limited. Applications requiring high efficiency transmitters range from Ka-band communication links for deep space probes to battery powered cellular telephones at 900 MHZ. While efficiency is clearly a key system driver for systems with limited prime power, it may also impact the system in more subtle ways. For example, inefficient power integrated circuits (IC's) in the transmitter can create power dissipation problems for the system and undue thermal stress on the system components including the IC's. That, in turn, may result in poor reliability and poor system performance, thereby dramatically impacting system cost.

While most MMIC designs focus only on the efficiency of the chip, in a system application, other sources of power loss are equally, if not more important to the overall system efficiency. Hence, to maximize system efficiency, it is important to examine how the chip is used in the system. For example, the avionics of a typical space-based system employs a "system bus" which is typically in the range of 20 to 30 volts. A power conditioning subsystem, consisting of a DC-to-DC converter and a series voltage regulator, provide the actual conditioned power to the transmitter IC's. In such a system, the converter has an efficiency ranging from 75 to 90 percent, depending on the output voltage. The regulator generally requires a DC voltage drop of at least 2 volts resulting in a further efficiency degradation of typically 75 percent (8 to 6 volts). Together, those two sources of inefficiency can reduce a respectable chip efficiency of, say, 30% down to 18% at the system level. Both the converter efficiency and the regulator efficiency can be improved by using a higher chip supply voltage. That is true because, in both cases, the source of the power loss is due to a fixed voltage and/or IR drop.

While increasing the chip supply voltage certainly improves the efficiency of the power conditioner, it unfortunately does not improve the efficiency of the active devices in the integrated circuit. That is due to the fact that maximum device power-added efficiency is realized for a voltage of typically 4 to 5 volts for Ka-band PHEMT's (Pseudomorphic High Electron Mobility Transistors). The traditional chip supply voltage of 6 to 7 volts represents a compromise between the device efficiency, output power and the power conditioner efficiency. While there are a few things that may be done with the device design and the GaAs doping profile to raise this voltage, they generally compromise the maximum efficiency and output power and only raise the terminal voltage marginally. Therefore, for high-efficiency power applications, a better method of raising the chip supply voltage is needed. Clearly, if a way could be found to raise the chip voltage without sacrificing the device efficiency, the overall system efficiency and reliability would benefit greatly. Further, if it were possible to raise the chip supply voltage high enough, it might even be possible to eliminate the DC-to-DC converter.

The present invention disclosure addresses the problem of DC-to-RF conversion efficiency of GaAs monolithic circuits (MMICS) used in RF, microwave and millimeter-wave communications systems.

SUMMARY OF THE INVENTION

It is the purpose of this invention to substantially raise the chip supply voltage without compromising the device efficiency. Specifically, using this invention, it is the objective of this work to demonstrate a Ka-band MMIC chip operating at 20 volts or more with a power-added efficiency of greater than 40%. This represents an efficiency level that is more than ten percentage points above the current MMIC state-of-the-art.

The invention solves the efficiency-voltage problem. It comprises a unique high-voltage bias scheme whereby the constituent field-effect transistor (FET) cells in the integrated circuit (IC) are biased in series instead of in parallel. Five equal sized (the cell size is given in microns) FET (or PHEMT) cells are connected as a 2-stage power amplifier with one cell driving four cells. The resistors, nominally identical in value, produce equal voltage drops across each of the cells. The series diodes (one or two) are required to compensate for $V_{GS}$, typically −0.4 volts. An input matching network, an interstage network and an output network, not the subject of this invention, are required to complete the amplifier circuit. Typically, all of those elements are integrated on a single MMIC chip.

A unique feature of the invention is that all the FET (or PHEMT) cells on the chip are biased in series as opposed to in parallel. An advantage of this series connected configuration is that it results in a higher bias voltage with a correspondingly lower bias current. With the configuration shown, the chip bias voltage is 5 times the $V_{DS}$ of an individual cell, and the current level is ⅕ that of a similar IC employing conventional parallel biasing. If, for example, $V_{DS}$=4.0 volts is selected for highest efficiency, the resulting chip bias voltage is 20 volts. Further, since the cells are in series, the total chip bias current is equal to the bias current of one cell or typically 100 mA for this example. In contrast, with a conventional design, all the cells are connected in parallel resulting in a bias current of 5×100 mA or 500 mA, and a bias voltage of only 4 volts.

The consequences of the lower bias current are quite significant when considered in the context of a system, e.g. a phased array system, which might employ hundreds or even thousands of these chips. The avionics on those systems employ a "system bus" which is typically in the range of 20 to 30 volts. With our new low current, high-voltage chip, the efficiency of a prospective system is significantly improved due to reduced losses in the DC-to-DC voltage converter and voltage regulator as described above. By increasing the chip supply voltage from 4 to 20 volts, the system power conditioning efficiency is improved from, typically, less than 80% to 90% or more. In fact, in some cases it may be possible to totally eliminate the power conditioning circuitry and "run" the IC's directly off the system bus.

In addition to the power conditioning efficiency gains, the lower chip bias current results in lower IR drops in the on-chip and off-chip bias distribution networks. Incidentally, that is the same reason electrical power companies transport their power on high-voltage power distribution networks. This $I^2R$ loss is not an insignificant power loss. For example, for the case cited above, if the bias distribution network has a total resistance of 1 ohm, this resistance produces a power loss of 250 mW/chip in the parallel case and only 10 mW/chip in the series case. This represents 12.5% of the DC power in the parallel case, while only 0.5% in the series case.

While a 5-cell version of this series bias configuration was used to demonstrate this invention, other configurations are possible that result in other chip supply voltages. In general, the supply voltage $V_S$ is limited to integer multiples of the cell voltage $V_{DS}$. While the cell size is not relevant to the present invention, all cells in series must have the same total gate periphery. A cell may be partitioned into two, as long as the total gate periphery of the two cells is equal to the requisite cell periphery. In another embodiment, in conjunction with $V_S = 2V_{DS}$, self-biasing source resistors are used in lieu of a separate gate bias.

Features of the invention are apparent in the disclosure, which includes the above and ongoing written specification with the claims and the drawings.

BRIEF DESCRIPTION OF THE DRAWINGS

Table 1 compares the performance of the new chip (shown in bold) to current state-of-the-art Ka-and MMIC chips.

DETAILED DESCRIPTION OF THE PREFERRED EMBODIMENTS

Figure 1:
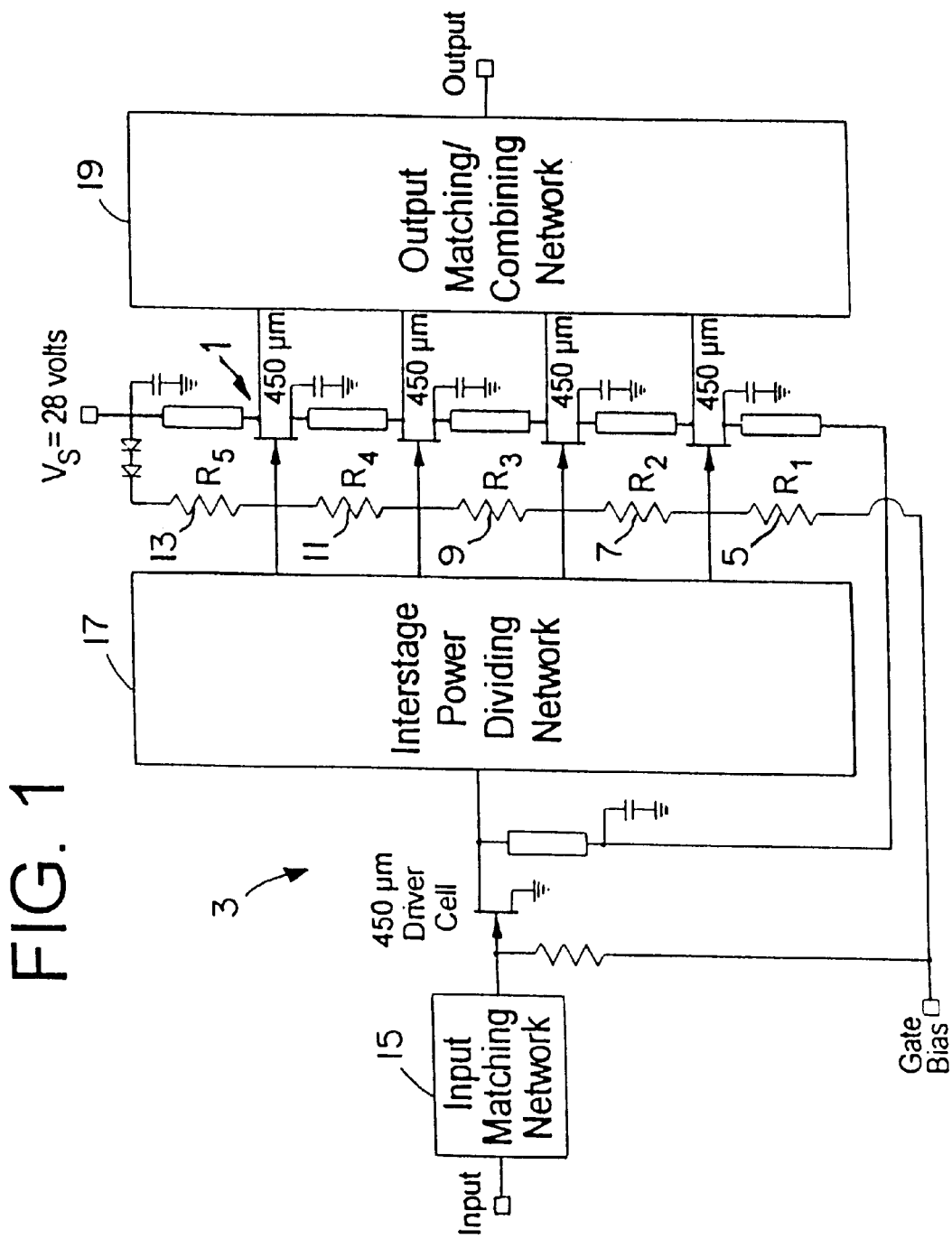
FIG. 1 is a block diagram of the new high-voltage bias scheme where the constituent FET cells in the IC are biased in series.

The invention solves the efficiency-voltage problem. It comprises a unique high-voltage bias scheme whereby the constituent field-effect transistor (FET) cells 1 in the integrated circuit (IC) 3 are biased in series instead of in parallel. A simplified block diagram of the approach is shown in FIG. 1. Five equal sized (the cell size is given in microns) FET (or PHEMT) cells 1 are connected as a 2-stage power amplifier with one cell driving four. While the invention contains an active bias network, for simplicity, the bias network is shown as a resistive divider network, $R_1$ through $R_5$ in FIG. 1. The resistors 5, 7, 9, 11 and 13, nominally identical in value, produce equal voltage drops across each of the cells 1. The cells are connected together by transmission line segments, nominally $\lambda/4$ in length, that isolate the cells at the RF frequency while providing a DC connection. The capacitors are required to connect the source of each constituent FET cell to ground at RF frequencies. The series diodes (one or two) are required to compensate for $V_{GS}$, typically –0.4 volts. An input matching network 15, an interstage network 17 and an output network 19, not the subject of this invention, are required to complete the two-stage amplifier circuit. Typically, all those elements are integrated on a single MMIC chip.

A unique feature of the invention is that all the FET (or PHEMT) cells on the chip are biased in series as opposed to in parallel. An advantage of this series connected configuration is that it results in a higher bias voltage with a correspondingly lower bias current. With the configuration shown, the chip bias voltage is 5 times the $V_{DS}$ of an individual cell, and the current level is ⅕ that of a similar IC employing conventional parallel biasing. If, for example, $V_{DS} = 4.0$ volts is selected for highest efficiency, the resulting chip bias voltage is 20 volts. Further, since the cells are in series, the total chip bias current is equal to the bias current of one cell or typically 100 mA for this example. In contrast, with a conventional design, all the cells are connected in parallel resulting in a bias current of 5×100 mA or 500 mA, and a bias voltage of only 4 volts.

The consequences of the lower bias current are quite significant when considered in the context of a system, e.g. a phased array system, which might employ hundreds or even thousands of these chips. The avionics on these systems employ a "system bus" which is typically in the range of 20 to 30 volts. With our new low current, high-voltage chip, the efficiency of a prospective system is significantly improved due to reduced losses in the DC-to-DC voltage converter and voltage regulator as described above. By increasing the chip supply voltage from 4 to 20 volts, the system power conditioning efficiency is improved from typically less than 80% to 90% or more. In fact, in some cases it may be possible to totally eliminate the power conditioning circuitry and "run" the IC's directly off the system bus.

In addition to the power conditioning efficiency gains, the lower chip bias current results in lower IR drops in the on-chip and off-chip bias distribution networks. Incidentally, this is the same reason electrical power companies transport their power on high-voltage power distribution networks. This $I^2R$ loss is not an insignificant power loss. For example, for the case cited above, if the bias distribution network has a total resistance of 1 ohm, this resistance produces a power loss of 250 mW/chip in the parallel case and only 10 mW/chip in the series case. That represents 12.5% of the DC power in the parallel case, while only 0.5% in the series case.

Figure 2A:
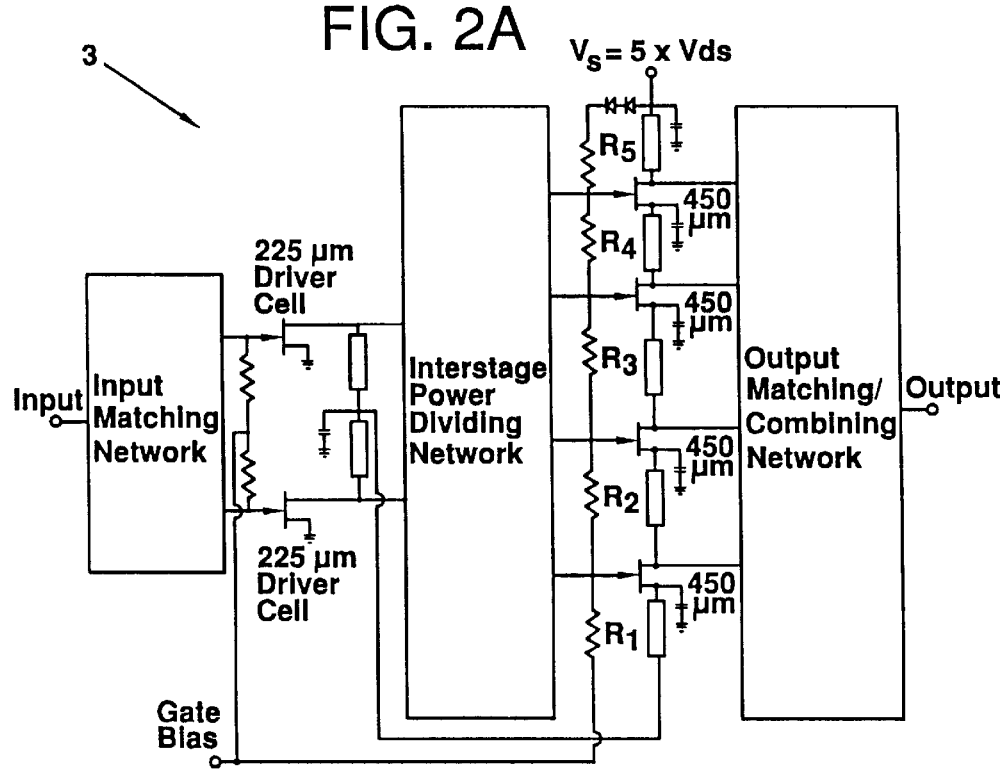
FIGS. 2A, 2B, 2C and 2D are four alternative configurations, where $V_S$ ranges from 5 to 2 $V_{DS}$, respectively.
Figure 2B:
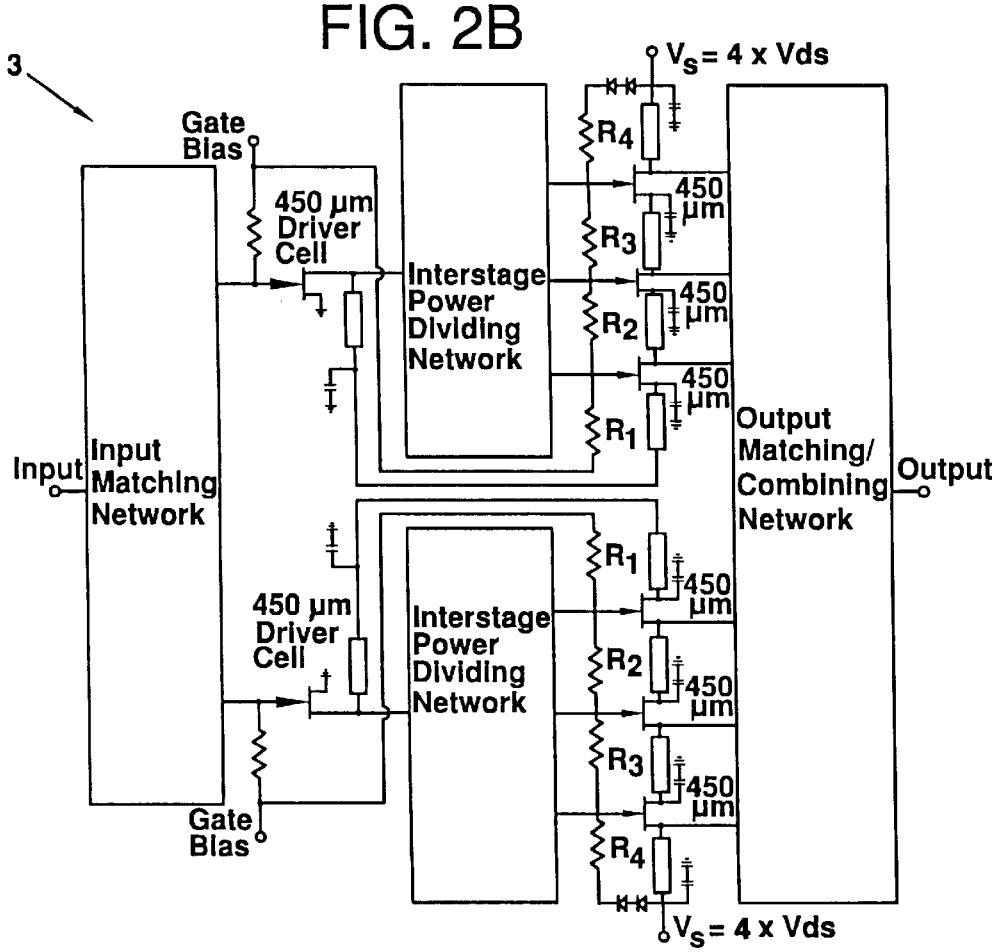
Figure 2C:
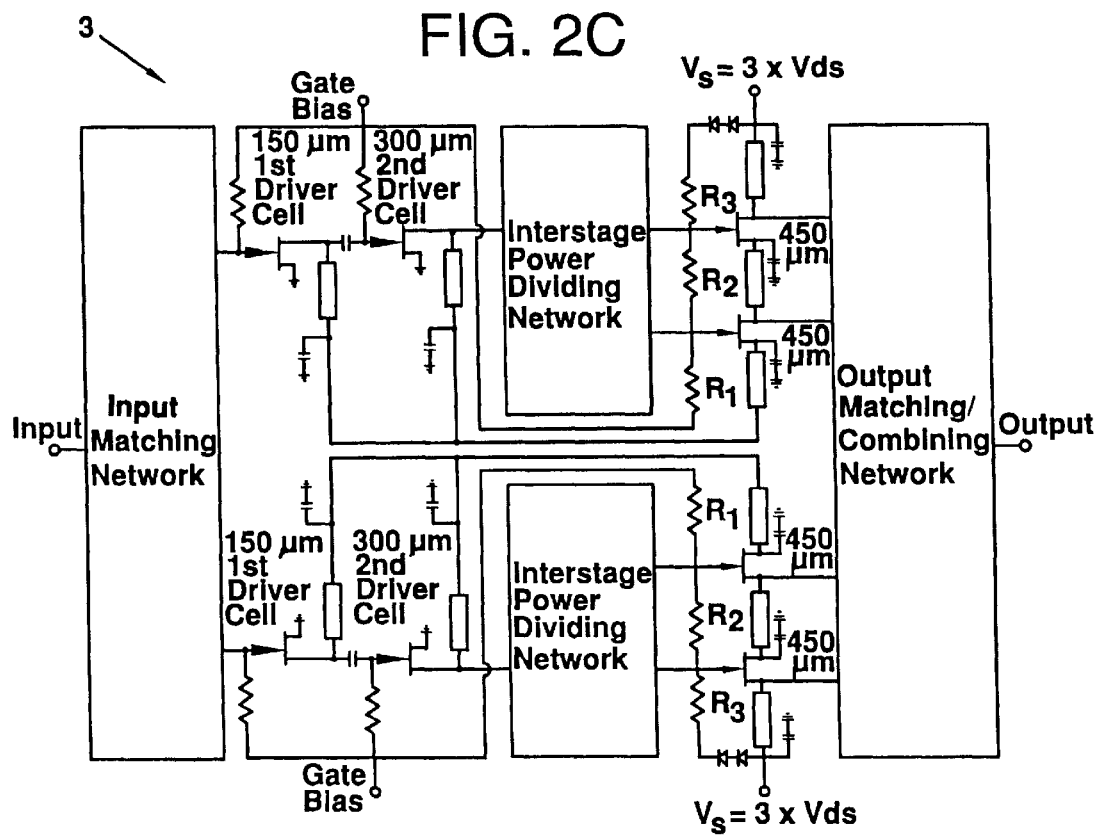
Figure 2D:
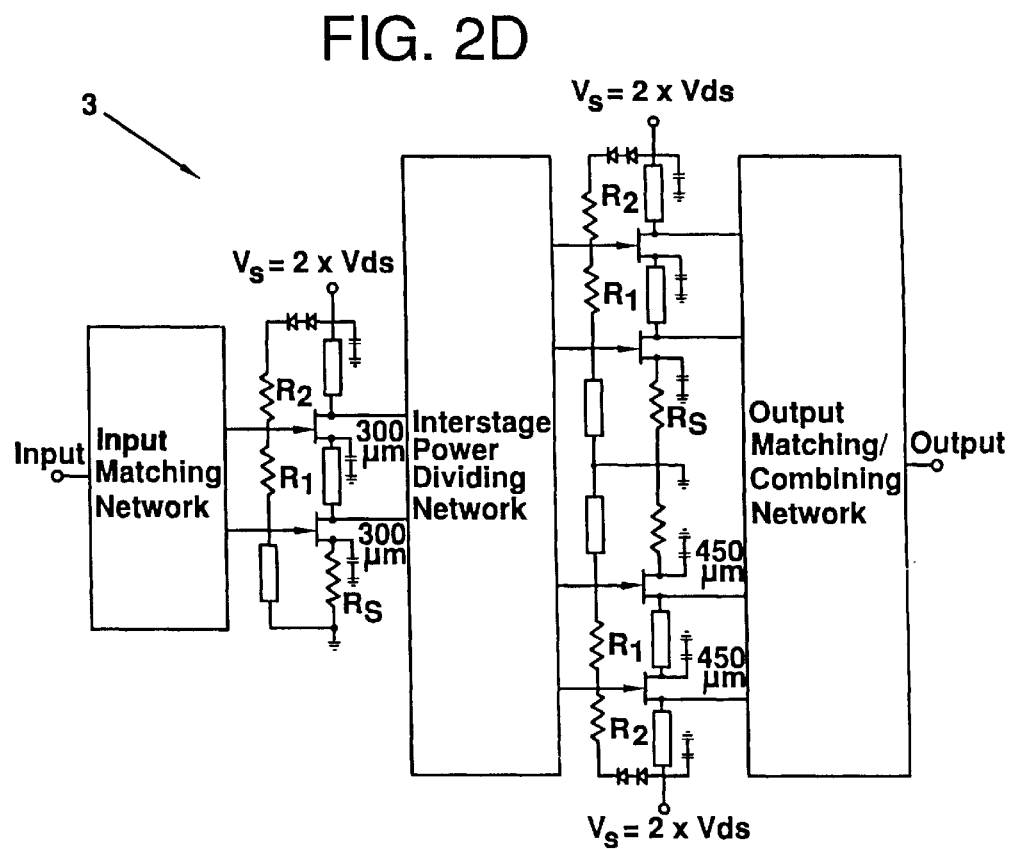

While a 5-cell version (FIG. 1) of this series bias configuration was used to demonstrate this invention, other configurations are possible that result in other chip supply voltages. FIGS. 2A, 2B, 2C and 2D illustrate four alternative configurations with a $V_S$ (chip supply voltage) ranging from $2V_{DS}$ to $5V_{DS}$. The gate periphery (size) of the cells are given in microns. In general, the $V_S$ is limited to integer multiples of the cell $V_{DS}$. While the cell size is not relevant to the invention, all cells in series must have the same total gate periphery. As shown in FIGS. 2A, 2B and 2C, one of the cells may be partitioned into two, as long as the total gate periphery of the two cells is equal to the requisite cell periphery. FIG. 2D illustrates another twist, where, in conjunction with $V_S = 2V_{DS}$, self-biasing source resistors are used in lieu of a separate gate bias.

In the conceptual diagram (FIG. 1), the IC bias circuit is shown as a simple series combination of 5 resistors and 2 diodes. The bias voltages required for the FET cells are generated by tapping into this series resistor string. While this simple scheme works in principle, it has one major limitation. If the cells in the array start to draw gate current (due to RF over-drive or excessive gate leakage), the voltage balance in the array will be disturbed. That may cause premature saturation and loss of output power and efficiency, and in an extreme case, may result in catastrophic failure of one or more of the cells due to over-voltage. For example, with a resistor value ($R_1$ through $R_5$ in FIG. 1) of 10K ohms, a gate current of only 0.1 mA produces a drain-source voltage shift or imbalance of 1 volt.

One possible solution is to reduce the resistor values to, say 1K ohms. While that would indeed reduce the voltage shift for a given gate current by an order of magnitude, it has the undesirable side effect of increasing the power dissipation, and hence, reducing the IC efficiency. For this example ($V_S = 25$ V), the bias resistor power dissipation would increase from a total of 12.5 mW to 125 mW. This would reduce the IC power added efficiency from 40.5% to 37.8%. That is clearly undesirable.

Figure 3:
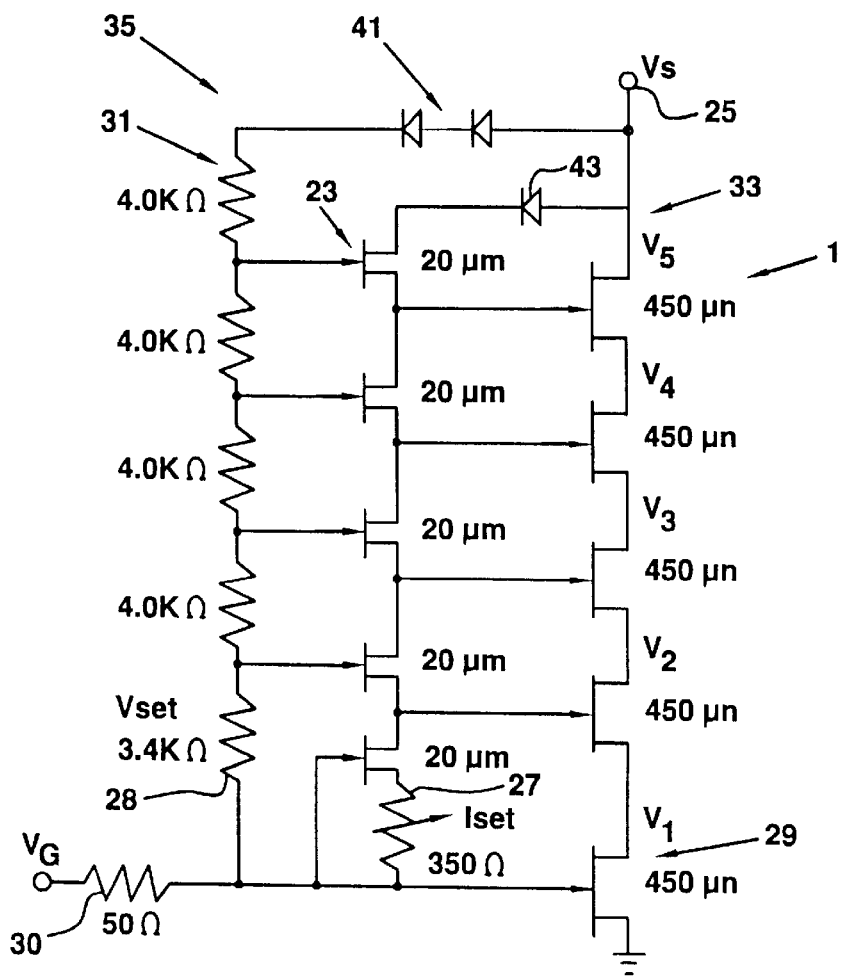
FIG. 3 is a block diagram of an active bias network.

As part of this invention, a new active bias network has been devised, as shown in FIG. 3, which solves that problem. It incorporates a second string of series cells 23 to act as a buffer between the resistive divider network 31 and the RF cell 1 array 33. Due to the transconductance of the buffer cells 23, they provide a low impedance voltage source (source follower) for the gate bias of the RF cell array 33. That improves the stability of the voltage divider network by a factor of 10 or more. The gate periphery of the devices in this secondary string is only 20 μm per cell, and consequently, they do not dissipate a great deal of DC power. The entire bias network 35 (resistors and active devices) requires a bias current of only 2 mA. This is typically 2% or less of the nominal chip bias current.

Figure 4:
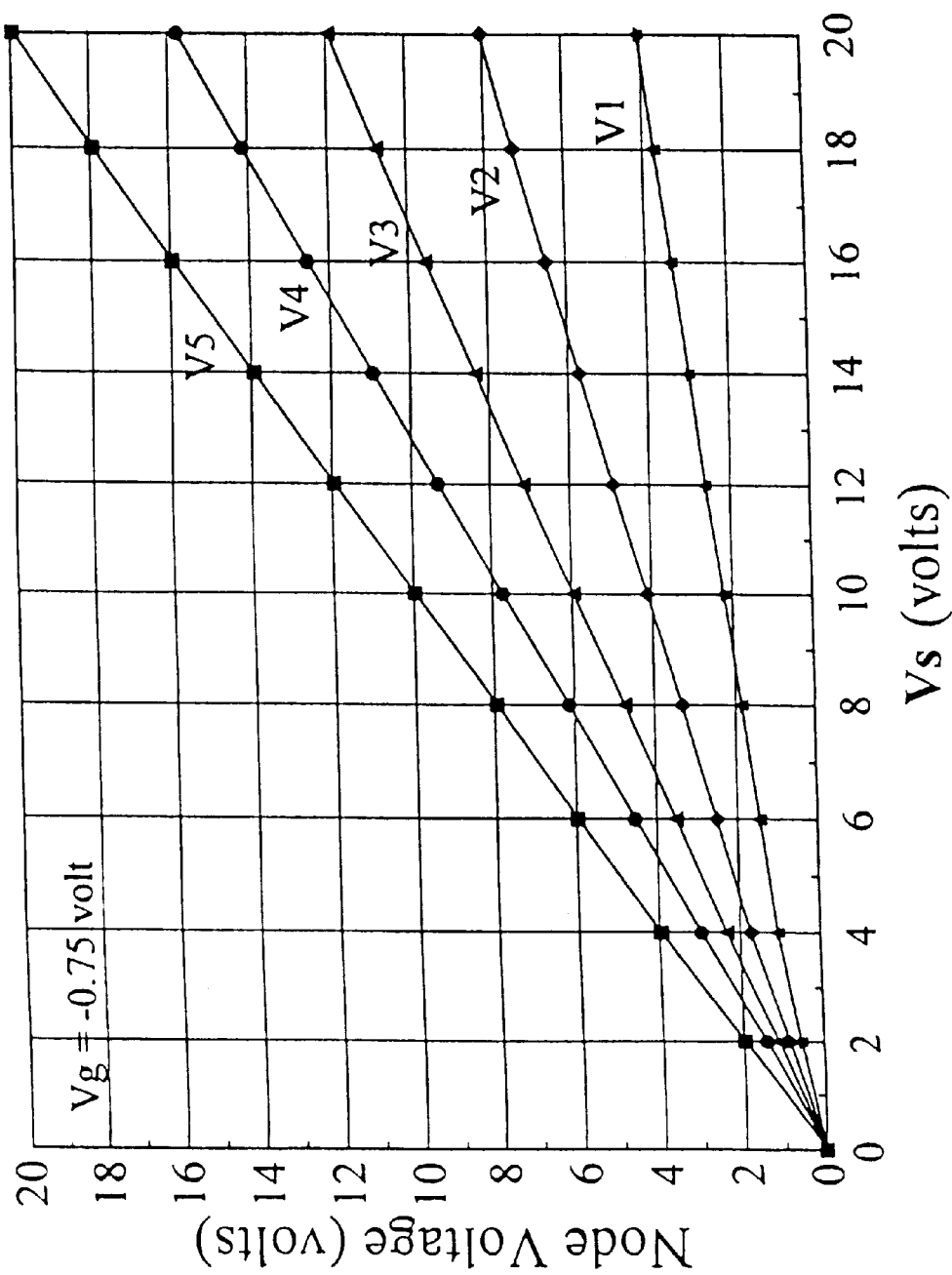
FIG. 4 is a graph of the node voltages versus the chip supply voltage.

This active bias scheme has several unique features. First of all, in a manner similar to the diodes 41 in the resistor string 31, the diode 43 in series with the cell bias array 23 compensates for the different drain-source voltage at the top of the array. This improves the drain-source tracking in the array with the chip supply voltage 25. The measured voltage tracking of the cell array with chip supply voltage, $V_S$, is shown in FIG. 4. Here, the node voltages $V_1$ through $V_5$ are plotted as a function of the chip supply voltage over the range of 0 to 20 volts. As shown, the tracking is excellent, particularly for voltages above 10 volts.

A second unique aspect of this invention is the programmable current source in the cell bias array. The resistor 27 next to the label "$I_{SET}$" in FIG. 3 sets the current in the bias array. This resistor 27 can be off-chip or can be realized on-chip as a 3 or 4 bit programmable resistor. The resistor 27 programs the current in the series bias array and, hence, determines the source impedance for the gate bias. The advantage of this is flexibility. The same circuit can be used for applications from those requiring little or no gate current to those requiring substantial gate current. By simply changing the resistor value, the source impedance for the gate bias can be changed over a wide range.

A third unique aspect of the invention is the ability to individually set the voltages in the array. That may be accomplished by varying the resistor values in the series string. That feature is used in FIG. 3 (the resistor 28 next to "$V_{SET}$") to set the drain-source voltage of the driver cell 29. In some cases, it may be desired to bias the driver cell at a somewhat higher voltage to insure that it is capable of driving the output array to its optimum power/efficiency point. Resistor 30 limits current and stabilizes the circuit against bias fluctuations.

Figure 5:
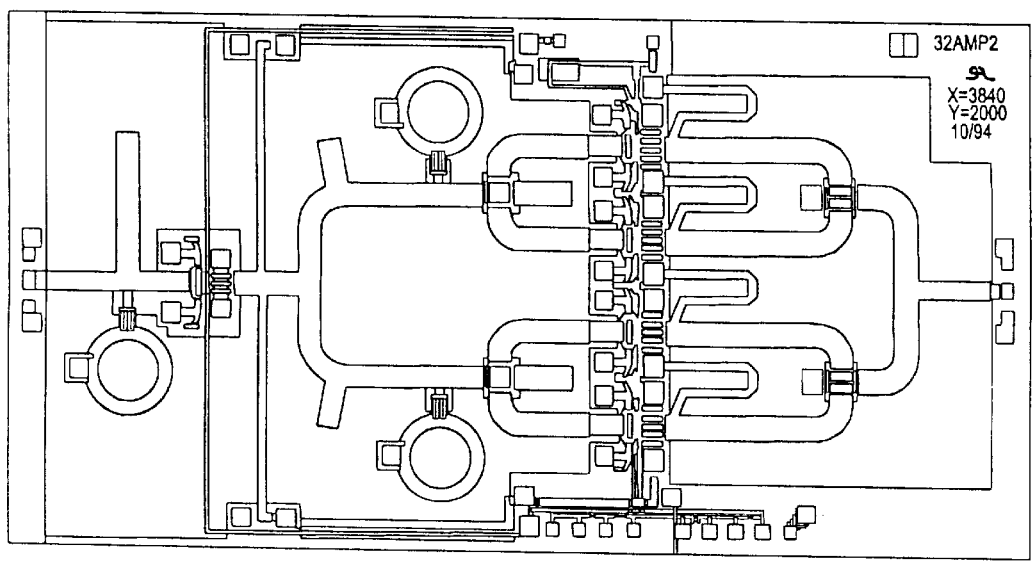
FIG. 5 is a top view of a high-voltage, high-efficiency Ka-band MMIC chip.

In order to demonstrate the invention, a microwave power IC has been fabricated and tested (as part of a NASA sponsored SBIR program) that achieves high efficiency while operating at high voltages. Operating at 20 to 28 volts, this IC has demonstrated a PAE (power-added efficiency) of greater than 40 percent with an output power as high as 1.1 watts at Ka-band frequencies. A top view photograph of the chip is shown in FIG. 5.

Table 1 compares the performance of this chip to current state-of-the-art Ka-band MMIC results.

Results of devices using the present invention (shown in bold) represent new levels of performance for MMICs operating at Ka-band frequencies. While comparable power levels have been previously reported, until now no one has simultaneously achieved both high power (>1 watt) and high efficiencies (>30%). Clearly, the new efficiency results are at least 10 to 12 percentage points higher than the best previously reported results. Further, those results were achieved using the unique series bias scheme that results in a low current, high voltage chip bias.

In summary, the high-voltage invention results in a MMIC that has the following significant advantages over conventional MMIC configurations: It results in lower system power conditioning losses due to the higher chip supply voltage. The voltage (IR) drops, and consequently power loss, in the bias distribution networks are smaller due to the lower current level. The individual cells can be biased at the optimum bias voltage for maximum efficiency without jeopardizing the efficiency of the power conditioning circuitry. The driver cell may be independently biased at a voltage different than the output cells to enhance its power, gain or efficiency. The chip bias is easier to control and modulate since the current level is lower. Only one (positive) bias supply voltage is required, and that voltage may be inserted at one point on the edge of the chip. No complicated on-chip bias distribution and decoupling network is required.

This high-voltage approach will have a major impact on the way high-efficiency power amplifiers are designed in the future. It has the potential to increase the efficiency of a system utilizing this invention by at least 20 percentage points. That, in turn, may result in a saving of millions of dollars at the system level and even make the difference between system feasibility and non-feasibility.

The invention provides a high-voltage, series-biased FET (or PHEMT) amplifier for high-efficiency applications.

This invention can be applied to any application requiring high-efficiency power amplifiers operating at RF and microwave frequencies. Specific commercial applications that may benefit from this invention include battery powered cellular telephones, wireless communications equipment operating for example at about 900 MHz, battery powered PCS at L and S-band and Ka-band LAN video links. Substantial applications exist in the expanding wireless communications market. Firms involved in the wireless market manufacturing high-efficiency power amplifiers should be users of the invention.

With conventional microwave integrated circuits, the constituent cells or active devices are biased in parallel, resulting in an IC with low-voltage, high-current bias requirements.

The new invention significantly improves efficiency over a prior art parallel-connected and series-connected bias circuits. The new multiple-stage, series-connected configuration makes series biasing practical.

While the invention has been described with reference to specific embodiments, modifications and variations of the invention may be constructed without departing from the scope of the invention, which is defined in the following claims.

I claim:

1. An internal two-stage power amplifier biasing system for an integrated circuit, comprising an input, an input matching network connected to the input, a driver cell connected to the input matching network, an interstage power dividing network connected to the driver cell, multiple second stage cells connected to the interstage power dividing network, a series-connected biasing network connected to the second stage cells for biasing the cells, an output matching and combining network connected to the second stage cells and an output connected to the output matching and combining network, wherein the second stage cells comprise cells arranged in separate groupings with separate biases series-connected to the cells in each grouping.

2. An internal two-stage power amplifier biasing system for an integrated circuit, comprising an input, an input matching network connected to the input, a driver cell connected to the input matching network, an interstage power dividing network connected to the driver cell, multiple second stage cells connected to the interstage power dividing network, a series-connected biasing network connected to the second stage cells for biasing the cells, an output matching and combining network connected to the second stare cells and an output connected to the output matching and combining network, wherein the interstage power dividing network comprises first and second interstage power dividing networks, and wherein a driver cell is connected respectively to each of the first and second interstage power dividing networks.

3. The system of claim 2, wherein the second stage cells comprise cells arranged in separate groupings with separate biases series-connected to each grouping, further comprising gate biases connected separately to the driver cells and connected separately in series to the separate groupings of the second stage cells.

4. The system of claim 3, wherein the driver cells comprise first and second paired cells, wherein cells in each of the paired cells are connected in series, and wherein the gate biases are connected in parallel to the cells in each of the paired cells.

5. The system of claim 2, wherein the driver cells respectively comprise first paired cells connected in series between the input matching network and the first interstage power dividing network, and second paired cells connected in series between the input matching network and the second interstage power dividing network.

6. The system of claim 1, wherein the series-connected biasing network is adjustable.

7. An internal two-stage power amplifier biasing system for an integrated circuit, comprising an input, an input matching network connected to the input, a driver cell connected to the input matching network, an interstage power dividing network connected to the driver cell, multiple second stage cells connected to the interstage power dividing network, a series-connected biasing network connected to the second stage cells for biasing the cells, an output matching and combining network connected to the second stage cells and an output connected to the output matching and combining network, wherein the series-connected biasing network comprises a resistive biasing network, and wherein the resistive biasing network further comprises a second string of series-connected cells acting as a buffer connected between the resistive ladder network and the multiple RF cells for biasing the second string of series-connected cells with the resistive ladder network and biasing the RF cells with cells in the second string of series-connected cells.

8. The system of claim 7, further comprising a gate bias connected to the active biasing network and to the second string of series-connected cells, and a variable resistor connected between the gate bias and a first cell in the second string for controlling current in the cells in the second string.

9. The system of claim 7, further comprising a gate bias connected to the resistive biasing network and to the second string of series-connected cells, and a variable resistance connected between the resistive biasing network and the gate bias for setting voltages in biasing network.

10. The system of claim 2, wherein the series-connected biasing network is adjustable.

11. The system of claim 7, wherein the series-connected biasing network is adjustable.

* * * * *